(12) United States Patent
Verber et al.

(10) Patent No.: US 6,369,937 B1
(45) Date of Patent: Apr. 9, 2002

(54) SERIAL DATA TO PARALLEL DATA CONVERTER

(75) Inventors: Carl M. Verber; Todd G. Ulmer, both of Atlanta, GA (US)

(73) Assignee: Georgia Tech Research Corp., Atlanta, GA (US)

( * ) Notice: Subject to any disclaimer, the term of this patent is extended or adjusted under 35 U.S.C. 154(b) by 0 days.

(21) Appl. No.: 09/615,252

(22) Filed: Jul. 13, 2000

Related U.S. Application Data
(60) Provisional application No. 60/143,564, filed on Jul. 13, 1999.

(51) Int. Cl.[7] ................................................. G02F 1/383
(52) U.S. Cl. ...................................... 359/328; 385/122
(58) Field of Search ............................... 359/328, 332; 385/122

(56) References Cited

U.S. PATENT DOCUMENTS

| | | |
|---|---|---|
| 4,961,621 A | 10/1990 | Su |
| 5,032,010 A | 7/1991 | Su |
| 5,172,258 A | 12/1992 | Verber |

*Primary Examiner*—John D. Lee
*Assistant Examiner*—Jerry T Rahll
(74) *Attorney, Agent, or Firm*—Todd Deveau; Ryan A. Schneider; Troutman Sanders LLP (57) ABSTRACT

An apparatus for converting an input optical serial data pulse stream into output optical parallel pulse streams comprises a waveguide that provides optical parallel pulse streams resulting from second-harmonic radiation generated by colliding a timing pulse against each data pulse of an optical serial data pulse stream input into the waveguide. The waveguide comprises a first reflector positioned at a location substantially opposing the waveguide's output. The first reflector reflects substantially all of the component of the second-harmonic radiation propagating in a direction away from the waveguide's output. The waveguide further comprises a second reflector opposing the first reflector and positioned between the first reflector and the waveguide's output to selectively reflect a portion of the component of the second-harmonic radiation propagating in a direction toward the waveguide's output.

19 Claims, 6 Drawing Sheets

SERIAL DATA TO PARALLEL DATA CONVERTER

CROSS-REFERENCE TO RELATED APPLICATION

This application claims the benefit of U.S. provisional patent application Ser. No. 60/143,564, filed on Jul. 13, 1999, now pending.

BACKGROUND

1. Field of the Invention

The present invention relates to a method and apparatus for performing optical serial-to-parallel data conversion. Amongst other things, the present invention utilizes second-harmonic generation to perform high-speed optical time-domain demultiplexing, optical code recognition and serial-to-parallel data conversion.

2. Background

Fiber-optic communication technology is being developed and commercialized at virtually unprecedented rates. It can be shown that, for transmission links on the order of kilometers, commercially available fibers can support data rates exceeding 100 Gb/s on a single optical carrier in the 1.3–1.6 micron wavelength range without resorting to operation at exactly the zero-dispersion wavelength. However, at these data rates, electronic components have difficulty generating, interpreting and/or switching the data. That is, the data rate conversion and manipulation has yet to catch up to the data transmission capabilities.

In view of the limitations of electronics, it is evident that to implement high-speed communication systems it is necessary to have a high-speed optical signal processing technology to compliment the high-speed optical-transmission technology. In addition, new system concepts which are compatible with the higher data rates and with the optical hardware should be developed.

One such concept being used to develop hardware to mate electrical and optical signal processing is the utilization of second-harmonic generation (SHG) and waveguide SHG in particular. Investigators Normandin and Stegeman have authored a number of papers detailing the occurrence of waveguide SHG. See for example: R. Normandin and G. I. Stegeman, "Non-Degenerate Four-Wave Mixing in Integrated Optics," *Optics Letters,* Vol. 4, No. 2, February 1979; "Picosecond Signal Processing with Planar, Nonlinear Integrated Optics,"*Applied Physics Letters,* Vol. 36, No. 4, Feb. 15, 1980; P. J. Vella, R. Normandin, and G. I. Stegeman, "Enhanced Second-Harmonic Generation by Counter-Propagating Guided Optical Waves," *Applied Physics Letters,* Vol. 38, No. 10, May 15, 1981; and, R. Normandin, S. Létoumeau, F. Chatenoud, and R. L. Williams, "Monolithic, Surface-Emitting, Semiconductor Visible Lasers and Spectrometers for WDM Fiber Communication Systems," *IEEE Journal of Quantum Electronics,* Vol. 27, No. 6, June 1991. Normandin and Stegeman demonstrated waveguide SHG in strongly nonlinear optical materials by inserting an optical pulse at one end of the waveguide and another optical pulse at the other end of the waveguide. When the two injected fundamental signals collided, they produced a second-harmonic wave that propagated perpendicular to the waveguide surface. A serial-to-parallel converter device that utilizes SHG for the purposes of data communication is disclosed in U.S. Pat. No. 5,172,258 (the '258 patent).

However, it is desirable to increase the efficiency of the second-harmonic conversion inside the waveguide of the serial-to-parallel converter of the '258 patent in order to make the converter compatible with the small pulse energies required for greater than 100 Gb/s fiber-optic transmission. Additionally, a problem associated with nonlinear optical waveguides, such as those used for SHG, is the existence of two-photon absorption, which reduces the conversion efficiency by absorbing photons at the fundamental wavelength. The effects of two-photon absorption increase as the photon energy of light provided to the input of the waveguide approaches and passes through the center of the band gap of the material utilized for the waveguide. Finally, input power is often lost due to less than optimum coupling between a fiber optic element communicating an input optical serial data pulse stream to the waveguide; see, for example, V. Vusirikala, S. S. Saini, R. E. Bartolo, M. Dagenais, and D. R. Stone, "Compact Mode Expanders Using Resonant Coupling Between a Tapered Active Region and an Underlying Coupling Waveguide," *IEEE Photonics Technology Letters,* Vol. 10, No. 2, February 1998.

Therefore, there is a need in the industry for a serial-to-parallel converter capable of optically converting a serial optical digital input signal into a set of parallel optical digital signals which addresses these and other related, and unrelated, problems.

SUMMARY OF THE INVENTION

The present invention allows the use of high-speed optical communication lines by efficiently converting a serial optical digital signal into a set of parallel optical digital signals. In one aspect, the present invention uses waveguide SHG to convert high-data-rate optical signals to lower data rates that are compatible with conventional high-speed electronic signal processing. The use of waveguide SHG also allows asynchronous operation, thereby greatly reducing circuit complexity as compared to conventional electronic methods of time demultiplexing or code recognition because clock recovery and synchronization can be done at the lower, demultiplexed data rate rather than at the greater than 100 Gb/s multiplexed rate.

According to a preferred embodiment of the present invention, second-harmonic photons are generated in the channel of a waveguide of an optical serial-to-parallel converter when each data pulse in an input serial optical data pulse stream collides with a single counter-propagating timing pulse. As currently conceived, half of the energy of the input optical stream is in the timing pulse, with the remainder divided equally among the data pulses. When the timing pulse reflects at the mirrored end of the waveguide, the timing pulse effectively counter-propagates through itself. This produces a comparatively large second-harmonic signal that is distinguishable from the reflections of the data pulses, and thus may be used as a trigger for other operations such as clock recovery and synchronization.

The collision between the timing pulse and each individual data pulse in the serial optical data pulse stream occurs at a predetermined, unique location in the waveguide. The SHG radiation generated by each collision travels in a direction which is perpendicular to the waveguide's longitudinal axis and parallel to the SHG radiation produced by other collisions. By placing a fiber optic element of a fiber optic array or a photodetector of a photodetector array above the location of each collision (i.e., at the waveguide's output), the serial-to-parallel converter derives a plurality of parallel output channels. In the case of fiber optic elements, the parallel output channels include a plurality of parallel optical data pulse streams. In the case of photodetectors, the parallel output channels include a plurality of parallel electrical signals.

In the preferred embodiment, a first reflector is positioned at a location substantially opposed to the waveguide output at the bottom of the waveguide's channel. The first reflector is, preferably, aligned to reflect a portion of the second-harmonic radiation propagating away from the waveguide output. A second reflector is interposed at a location between the first reflector and the waveguide output. Preferably, the second reflector is located on the exit surface of the waveguide at the waveguide's output. The second reflector selectively reflects a portion of the second-harmonic radiation propagating toward the waveguide output. Cooperating together to define a vertical resonant cavity in the waveguide that is resonant at the wavelength of the second-harmonic radiation, the first and second reflectors direct at least a portion of the plurality of photons of the second-harmonic radiation from each timing pulse-data pulse collision through the resonant cavity more than once during the time at which the collision occurs, thereby causing the generation of additional second-harmonic light. By generating additional second-harmonic light from each timing pulse-data pulse collision, the efficiency of the optical serial-to-parallel converter is increased. For the approximately 1 ps pulses required for greater than 100 Gb/s operation, the efficiency of the optical serial-to-parallel converter with the vertical resonant cavity is enhanced by one to two orders of magnitude over that of an optical serial-to-parallel converter without a resonant cavity. The increase in efficiency enables the device to be used in conjunction with an optical pre-amplifier to demultiplex data at power levels found in typical fiber optic communication systems.

In another embodiment of the present invention, an optical serial-to-parallel converter comprises a waveguide having a core interposed between first and second cladding. The core includes a first plurality of material layers having a high nonlinearity and a second plurality of material layers having a nonlinearity that is substantially less than the nonlinearity of the first plurality of material layers. The material layers of the first plurality of material layers and the second plurality of material layers are arranged in an alternating manner so that no material layer of the first plurality of material layers is adjacent to another material layer of the first plurality of material layers. Similarly, no material layer of the second plurality of material layers is adjacent to another material layer of the second plurality of material layers. Preferably, the material layers of the first and second pluralities of material layers include an aluminum gallium arsenide alloy. Preferably, the content, or concentration, of aluminum in the aluminum gallium arsenide of the material layers of the first and second pluralities of material layers is, respectively, in the ranges of twenty to thirty-five percent and eighty to ninety percent. By using an aluminum gallium arsenide alloy with a twenty to thirty-five percent aluminum content instead of gallium arsenide, the two-photon absorption coefficient in the waveguide is reduced from approximately 8 cm/GW to less than 0.5 cm/GW at a fundamental, or input, light wavelength of 1.5 microns (i.e., which is used for fiber optic communications), thereby increasing the efficiency of the converter. In addition, use of an aluminum gallium arsenide alloy with a twenty to thirty-five percent aluminum content decreases the waveguide's linear absorption of the second-harmonic light generated by the timing pulse-data pulse collisions.

According to still another embodiment of the present invention, an optical serial-to-parallel converter comprises a spot size converter which is optically interposed between an fiber optic element communicating an input serial optical data pulse stream to the converter and the input of the converter's waveguide. Use of a spot size converter enables the substantial matching of the mode-diameter of the waveguide's input and the mode-diameter of the fiber optic element, thereby reducing the loss of power input to the waveguide and, hence, improving the overall efficiency of the converter. Substantial matching of the mode-diameters of the waveguide's input and the fiber optic element also relaxes the alignment tolerances for the waveguide and fiber optic. Spot size converters are also employable at the waveguide's output to substantially match the mode diameter at the waveguide's output to the fiber optic elements of a fiber array with materially the same benefits.

One application of a serial-to-parallel converter of the present invention is time-domain demultiplexing. Where the input to the converter is a time-domain multiplexed (TDM) data stream comprised of a series of data frames, each data frame constituting one epoch of a TDM bit sequence, then each of the parallel output channels will carry demultiplexed data from the single input serial data stream.

Another application of a serial-to-parallel converter of the present invention is optical code recognition. In this case, the input to the converter is a binary code word represented by a series of optical pulses. The parallel output channels are switched on or off to represent a particular code word, and the resulting output is integrated (summed) and passed through an electronic threshold detector to determine if a given input signal matches the selected code word.

Another application of a serial-to-parallel converter of the present invention is serial-to-parallel data conversion. In this case, the serial-to-parallel converter functions exactly as for TDM demultiplexing. The primary difference is that the input serial data stream is created by multiplexing parallel channels from a single source (e.g. a high-speed computer bus) instead of multiple channels from different sources.

It is therefore an object of the present invention to convert an input serial optical data pulse stream into a plurality of output parallel optical data streams.

Another object of the present invention is to increase the efficiency of a serial-to-parallel converter for optical data by causing the generation of additional second-harmonic light.

Still another object of the present invention is to enable the use of a serial-to-parallel converter for optical data with an optical pre-amplifier to demultiplex data at power levels found in typical fiber optic communication systems.

Still another object of the present invention is to reduce the two-photon absorption in the waveguide of a serial-to-parallel converter for optical data.

Still another object of the present invention is to decrease the linear absorption of second-harmonic light generated by timing pulse-data pulse collisions in the waveguide of a serial-to-parallel converter for optical data.

These and other objects, features, advantages, and applications of the present invention will become apparent upon reading and understanding this specification, taken in conjunction with the accompanying drawings.

BRIEF DESCRIPTION OF THE DRAWINGS

FIGS. 3a–3g are a series of timing diagrams illustrating the spatial separation of the coincidence of the data pulses and the counter-propagating timing pulse and the coincidences among data pulses in the operation of the converter of the present invention;

DESCRIPTION OF THE DRAWINGS

Turning now to the figures, in which like numerals represent like components throughout the several views, preferred embodiments of the present invention may be seen.

Figure 1:
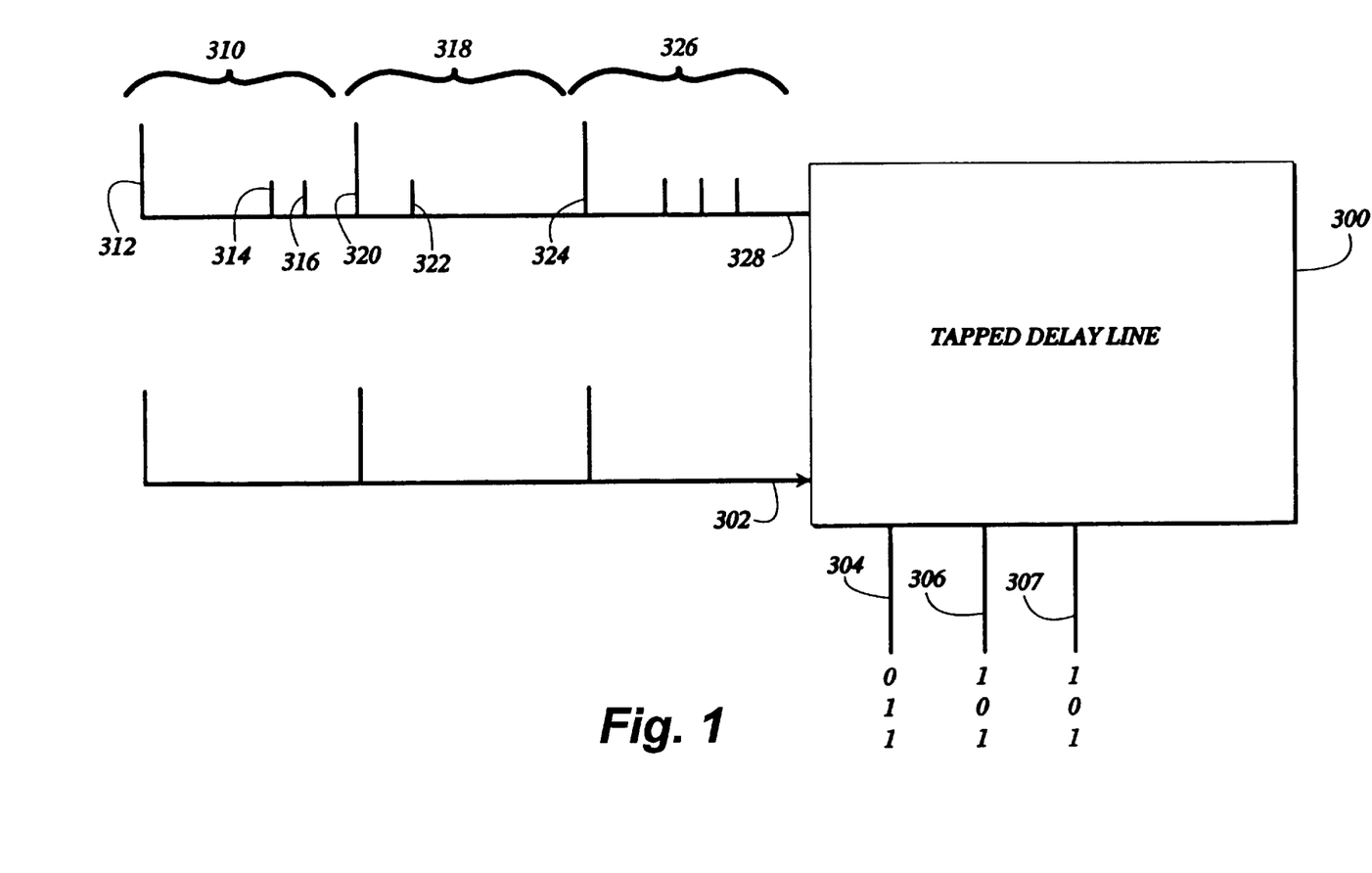
FIG. 1 is a block diagram illustrating the operation of the tapped delay line of the present invention according to one embodiment of the present invention.

Turning now to FIG. 1, a time multiplexer according to one embodiment of the present invention can be seen. The tapped delay line 300 has an optical input 302; for each epoch of data to be output on output line 328, an optical pulse is strobed into the tapped delay line 300. The number of optical pulses which appear on output line 328 for each epoch of data depends upon the settings of, or input data placed on, the control lines 304, 306, and 307 to the switches of tapped delay line 300, with the maximum number of pulses per epoch equal to the number of bits per epoch plus one, to account for the timing pulse associated with each epoch of data. A tapped delay line suitable for use with the present invention is described in U.S. Pat. No. 5,172,258.

When operated as a multiplexer, each electronic switch control line 304, 306, and 307 represents an individual data channel. When the input data on control lines 304, 306, and 307 is [011], respectively, the first epoch of data 310 on output line 328 will be [011], where a "zero" output data value is indicated optically by the absence of an optical pulse, and a "one" output data value by the presence of an optical pulse. The data pulses (also referred to herein as "bits" or "optical bits") in epoch 310 are preceded by timing pulse 312, which has twice the intensity of any of the data pulses, 314 or 316, and preferably, but not necessarily, is spaced apart from the first pulse by a time, T, equal to 1.5×t, where "t" equals the time between adjacent data pulses, as described below. Each optical pulse, or bit, is preferably spaced equally from the adjacent data pulse, or bit, be it a one or a zero. The second epoch of data 318 on output line 328 includes only a single data pulse 322 at the beginning of the epoch because the input on control lines 304, 306, and 307 is [100]. The third epoch of data 326 on output line 328 contains three optical data pulses because the input on control lines 304, 306, and 307 is [111].

The tapped delay line 300 of the present invention operates in a substantially similar manner when used as a code generator. The primary difference between operation of the tapped delay line 300 as a code generator and as a data multiplexer is that control lines 304, 306, and 307 would be operated by a controller in code generator operation, rather than by individual data channels in data multiplexer operation.

Figures 2, 3A:
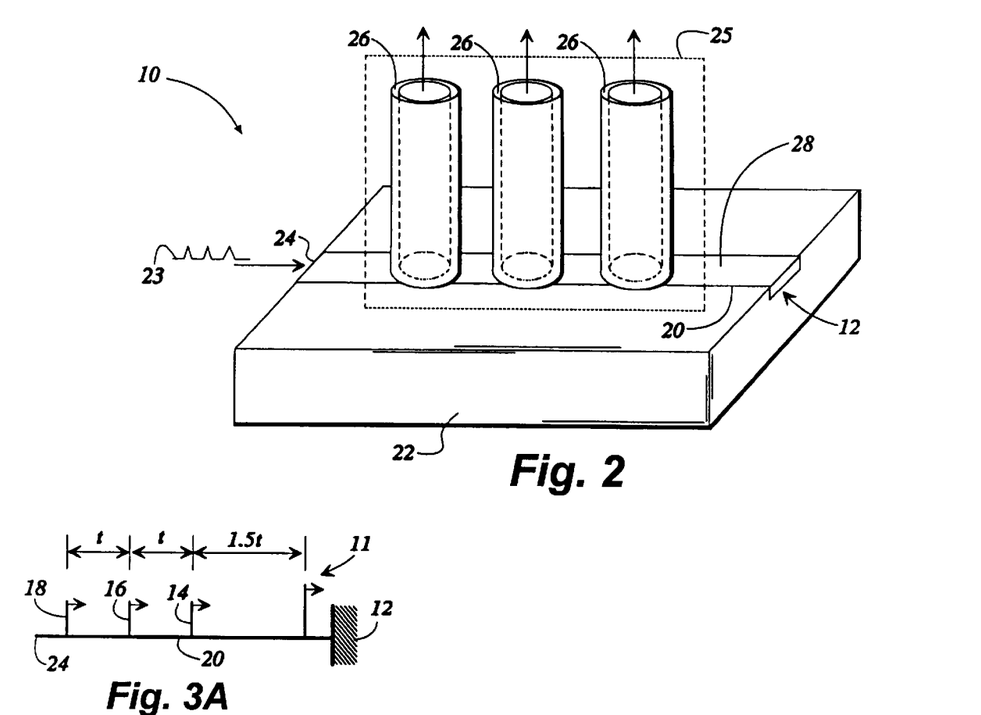
FIG. 2 illustrates an optical serial-to-parallel converter of the present invention.
FIG. 3a shows a timing pulse propagating ahead of a data pulse stream having three data pulses.

Turning now to FIG. 2, an optical serial-to-parallel converter 10 according to a preferred embodiment of the present invention may be seen. The serial-to-parallel converter includes a multilayer optical waveguide 20 (also referred to herein as "waveguide 20") supported by a block of substrate material 22. Waveguide 20 is, preferably, a channel waveguide because a channel waveguide allows high power efficiency over the entire length of the device. However, the present invention may also be practiced by replacing channel waveguide 20 with a planar waveguide.

The core of the waveguide 20 is, preferably, made of alternating layers of aluminum gallium arsenide (AlGaAs) material with two different aluminum contents, or concentrations. At a given wavelength, the nonlinearity of AlGaAs decreases with increasing aluminum concentration; thus, regions of high and low nonlinearity can be produced by alternating layers of low and high aluminum concentration. If these layers are chosen to be a half-wavelength thick at the second-harmonic wavelength, a quasi-phase matching (QPM) condition is achieved which allows efficient SHG. Optimum QPM is achieved for the largest ratio of high and low nonlinearity, which would require the choice of the AlGaAs endpoint materials GaAs and AlAs. In practice, AlGaAs alloys with 80–90% aluminum concentration are preferred over AlAs, which reacts with water in the atmosphere to form an oxide, resulting in the degradation of exposed facets. GaAs can be used successfully as the high nonlinearity material for low input intensities; however, in the 1.3–1.6 micron region used for fiber optic communications, two-photon absorption (TPA) of the input light (also referred to herein as "fundamental light") can occur for high intensities, resulting in reduced device efficiency. By using an AlGaAs alloy with 20–35% aluminum composition instead of GaAs, the effective TPA coefficient in the waveguide 20 is reduced from approximately 8 cm/GW to less than 0.5 cm/GW at 1.5 microns. The amount of TPA is proportional to the square of the intensity of the input light, and thus the reduction of the TPA coefficient by more than a factor of ten results in a reduction of TPA by more than a factor of one hundred. This is sufficient for operation at the intensities required in a greater than 100 Gb/s communications system. Furthermore, the use of 20–35% AlGaAs eliminates linear absorption of the second-harmonic light, which is critical to the resonant enhancement process described below. Similarly, the waveguide 20 may be adapted to operate in the 1.3 μm range by using an AlGaAs alloy of 35–50% for the high nonlinearity layers, with the appropriate thickness to meet the QPM condition. Other choices for waveguide 20 materials include ferroelectric materials, such as lithium niobate or any other materials whose nonlinearity is on the order of or greater than that of lithium niobate ($LiNbO_3$), such as semiconductor materials. Alternately, strongly nonlinear organic materials may be used for the waveguide 20, examples of which include polydiacetylene or MNA, (2-methyl-4-nitroaniline).

When using a channel waveguide 20 such as that shown in FIG. 2, it is preferred that the channel 28 be thinner in depth than in width, the strength of the second harmonic being a decreasing oscillatory function of the waveguide depth. However, if the channel 28 is too small, it may lose some of its ability to retain the optical data pulses and lose efficiency. Channel 28 dimensions, acceptable in accordance with the present invention, include dimensions of 1×3 to 1×10 microns.

One end 12 of the waveguide 20 is mirrored (i.e., has a reflector) so that an optical pulse incident upon it will be reflected. An input optical serial data stream 23 is injected into waveguide 20 through waveguide input 24. SHG occurs when a previously injected pulse is reflected and, while counter-propagating, collides with a subsequently injected pulse.

An optical fiber array 25 (also referred to herein as a "fiber array 25") receives and collects output optical parallel data pulses as the SHG collisions occur. The number of data pulses, or bits, contained in a frame of the input optical serial data stream 23 determines the number of individual optical fibers 26 (also referred to herein as "fiber optic elements 26" or "optical fibers 26") needed in array 25. The fiber array 25 is placed above and perpendicular to the longitudinal axis of waveguide 20. One end of each optical fiber 26 of fiber array 25 optically couples to, or adjoins, waveguide 20. The location of each optical fiber with respect to the mirrored end 12 is determined and dictated by the location where each input data pulse collides with the counter-propagating timing pulse 11, as will be discussed in detail hereinbelow. The far end of each optical fiber 26 is connectable to a detector, which converts the output optical parallel data pulses into electronic signals.

Turning now to FIG. 3, timing diagrams for the serial-to-parallel converter of the present invention may be seen. Note that the arrows associated with the data and timing pulses indicated their direction of travel within waveguide 20. Input data pulses 14, 16 and 18 are separated from each other in time by a period of time "t". The series of input data pulses 14, 16, and 18 represent one frame of a series of frames in an input data stream or a specific 3-bit binary code. The timing pulse 11 is, preferably, offset by 50% relative to the data pulses 14, 16, and 18. Thus, in the preferred embodiment, timing pulse 11 precedes the first data pulse 14 by a period of time, "T", equal to 1.5×t, although any time which satisfies the equation for T below will suffice.

$$T=(n+1/2)\times t$$

where:

T=the time by which the timing pulse 11 precedes the first data pulse 14 into the channel 28;

t=the time between adjacent data pulses 14, 16, 18 in the data pulse stream 23; and, n=any integer( . . . −1,0,1,2 . . . ).

In FIGS. 3a–3g, timing pulse 11 is shown preceding data pulses 14, 16 and 18 into the channel 28 of the waveguide 20; however the serial-to-parallel converter of the present invention will also function if timing pulse 11 lags the data pulses 14, 16, and 18.

Figure 3B:
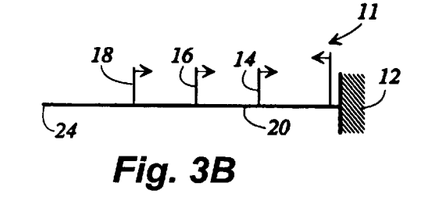
FIG. 3b shows the timing pulse counter-propagating towards the data pulse stream.
Figure 3C:
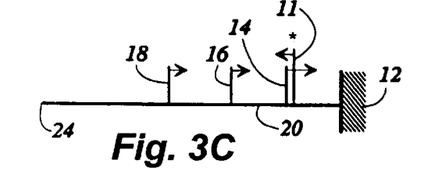
FIG. 3c shows the generation of second-harmonic light by the collision of the timing pulse with the first data pulse of the data pulse stream.

Upon reflection at mirrored end 12, timing pulse 11 counter-propagates toward the first data pulse 14. As can be seen in FIG. 3c, SHG occurs when timing pulse 11 collides with first data pulse 14, with the second-harmonic wave propagating perpendicular to the longitudinal axis of waveguide 20. This second harmonic radiation is detected and received by an appropriately placed optical fiber 26.

Figure 3D:
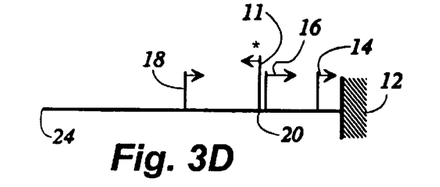
FIG. 3d shows the generation of second-harmonic light by the collision of the timing pulse with the second data pulse of the data pulse stream.

Timing pulse 11 continues to counter-propagate in waveguide 20 and eventually collides with the second data pulse 16, as can be seen in FIG. 3d. Once again, second-harmonic radiation generation occurs, though at a different location in waveguide 20 from the previous collision.

Figure 3E:
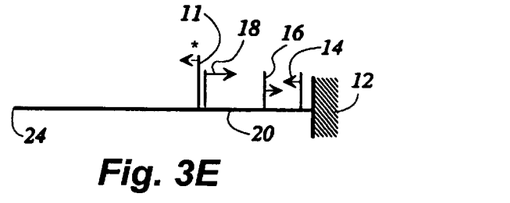
FIG. 3e shows the generation of second-harmonic light by the collision of the timing pulse with the third data pulse of the data pulse stream.

As can be seen in FIG. 3e, the counter-propagating timing pulse 11 eventually collides with the third data pulse 18. Again, a third channel of data may be demultiplexed from the serial data stream 23 by appropriately placing yet another optical fiber 26 above waveguide 20. The precise location in the channel 28 where timing pulse-data pulse collisions occur is determined by the geometry of the optical tapped delay line 300 used to generate the pulse sequence. This also determines the proper placement of each optical fiber 26.

Figure 3F:
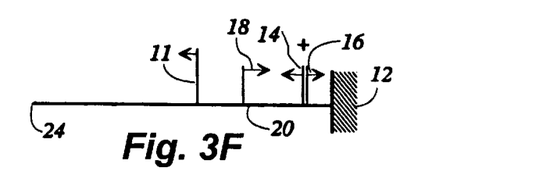
FIG. 3f shows the collision of the counter-propagating first data pulse with the second data pulse.

FIG. 3f shows the collision between the first data pulse 14, now counter-propagating through waveguide 20, and the second data pulse 16. As can be seen, this collision occurs in a different location than the locations of timing pulse-data pulse collisions because the timing pulse 11 has been injected into the input data stream 23 with a 50% offset relative to the data pulses 14, 16, and 18. Thus, SHG caused by data pulse-data pulse collisions does not cause any interference with the second-harmonic radiation, or light, generated by the timing pulse-data pulse collisions.

Figure 3G:
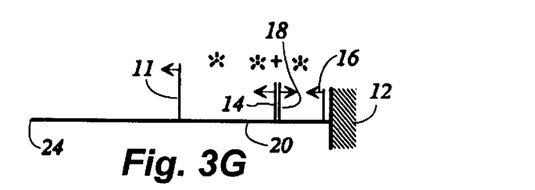
FIG. 3g shows the collision of the counter-propagating first data pulse with the third data pulse.

FIG. 3g also shows a collision between data pulse 14 and data pulse 18. Again, the collision occurs at a location distinct and different from any of the data pulse-timing pulse collisions, and thus does not interfere with the serial-to-parallel conversion. The location of each data pulse-data pulse collision is determined by the geometry of the optical tapped delay line 300 used to generate the pulse sequence.

The consequence of the positioning of the timing pulse 11 is that there is spatial separation of the desired second harmonic due to the timing pulse-data pulse collisions and the undesired second harmonic due to collisions among the different data pulses. Since the relative positions of the pulses 11, 14, 16, and 18 are determined during the sequence generation process, the output can be collected by a linear fiber optic array 25 having properly positioned optical fibers 26. It is now seen that this invention provides a technique for using optical second-harmonic generation to convert a high-rate optical serial pulse stream into a set of optical parallel pulse streams, each of which has a data rate which is slow enough to be handled by high-speed detectors and subsequent electronic components.

Figure 4:
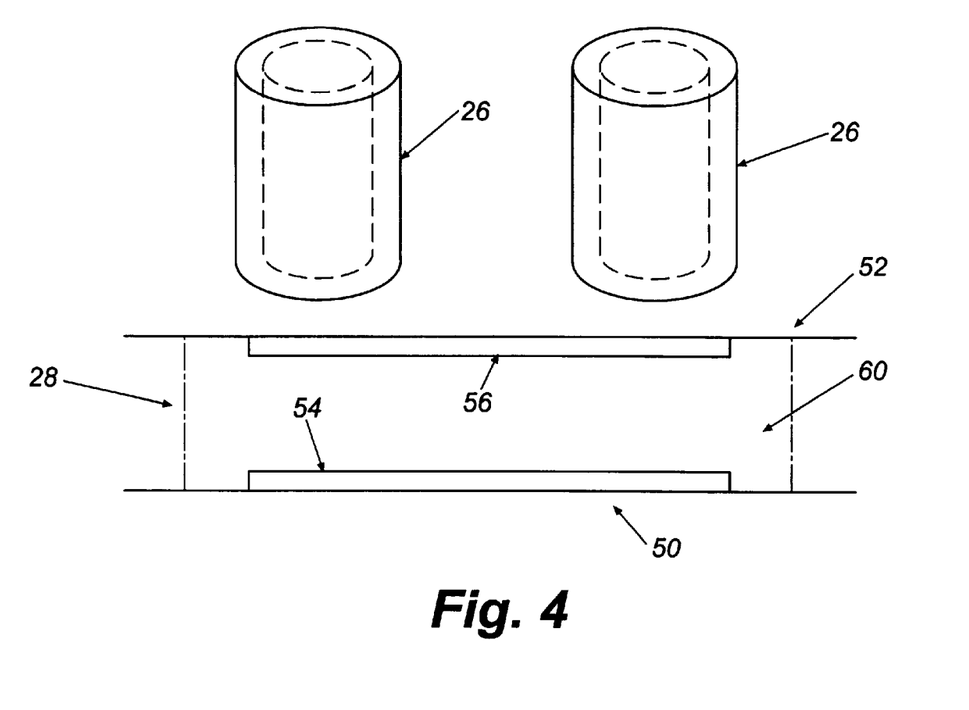
FIG. 4 illustrates an enlarged view of a portion of a waveguide according to a preferred embodiment of the present invention.

Referring to FIG. 4, the bottom 50 of the channel 28 of the waveguide 20 includes a bottom reflector 54. The bottom reflector 54 is designed to reflect the light that is the portion of the SHG that is headed toward the bottom 50 of channel 28 back to the input of the fiber array 25. In this way, the component of the SHG that would, otherwise, be absorbed by the substrate 22 supporting the waveguide channel 28 is reflected and redirected to the fiber array 25. Bottom reflector 54 is, preferably, highly reflective, e.g. greater than 99% power reflectance.

In addition to bottom reflector 54, a top reflector 56 at the top 52 of the channel 28 is incorporated. Top reflector 56 is, preferably, not completely reflective, but is instead, a partial reflector. The top reflector 56 and the bottom reflector 54 together form a resonant cavity 60, with a narrower wavelength resonances resulting from the use of higher reflectances. The optimum reflectance for the top reflector 56 is determined by the optical bandwidth required to support a desired pulse width; for example, at 1.5 $\mu$m, a 1 ps pulse requires 2–3 nm of optical bandwidth, resulting in a preferred reflectance of approximately 98% for the top reflector 56. Longer duration pulses require less bandwidth and can therefore make use of higher reflectance top reflectors 56, resulting in a larger resonant enhancement. The distance between the top reflector 56 and the bottom reflector 54 is chosen so that the cavity is resonant at the second-harmonic wavelength that corresponds to the desired input fundamental wavelength.

It should be noted that both top reflector 56 and bottom reflector 54 are, preferably, distributed Bragg reflectors. Bottom reflector 54 is designed to at least double the energy conversion of the waveguide 20 by turning back the SHG light propagating toward the bottom 50 of the channel 28. The top reflector 56 and the bottom reflector 54 are appropriately positioned to produce reflected light that is in phase with newly generated second-harmonic light in the waveguide 20. The addition of a top reflector 56 to the channel 28 creates a resonant cavity 60 that significantly increases the efficiency of the serial-to-parallel converter. It can be shown that the total second-harmonic power is proportional to the square of the time during which the second-harmonic and fundamental pulses overlap. This is due to the coherent nature of the second-harmonic nonlinear optical process. In the absence of the top reflector 56, a second-harmonic photon makes a single pass through the region of the waveguide 20 where the fundamental, or input, pulses are confined. With the addition of the vertical resonant cavity 60, each photon of the second-harmonic radiation makes several passes through the waveguide 20 during the time the fundamental, or input, pulses overlap, which results in the generation of additional second-harmonic light. Since the reflectance of the top reflector 56 is less than that of the bottom reflector 54, the second-harmonic light is preferentially emitted through the top reflector 56, where it can be collected, or detected, with the fiber array 25. Some fraction of the second-harmonic light will continue to be confined inside the resonant cavity 60 for a short time after the fundamental pulses have passed through each other. During this time no new second-harmonic light is generated since there is no fundamental light present; the remaining second-harmonic light leaks through the partially-reflective top reflector 56 over a time on the order of 10 ps that is determined by the reflectance of the top reflector 56. This is a short enough time that all of the second-harmonic light will escape from the resonant cavity 60 before the timing-pulse data-pulse collision from the next frame of data occurs.

Figure 5:
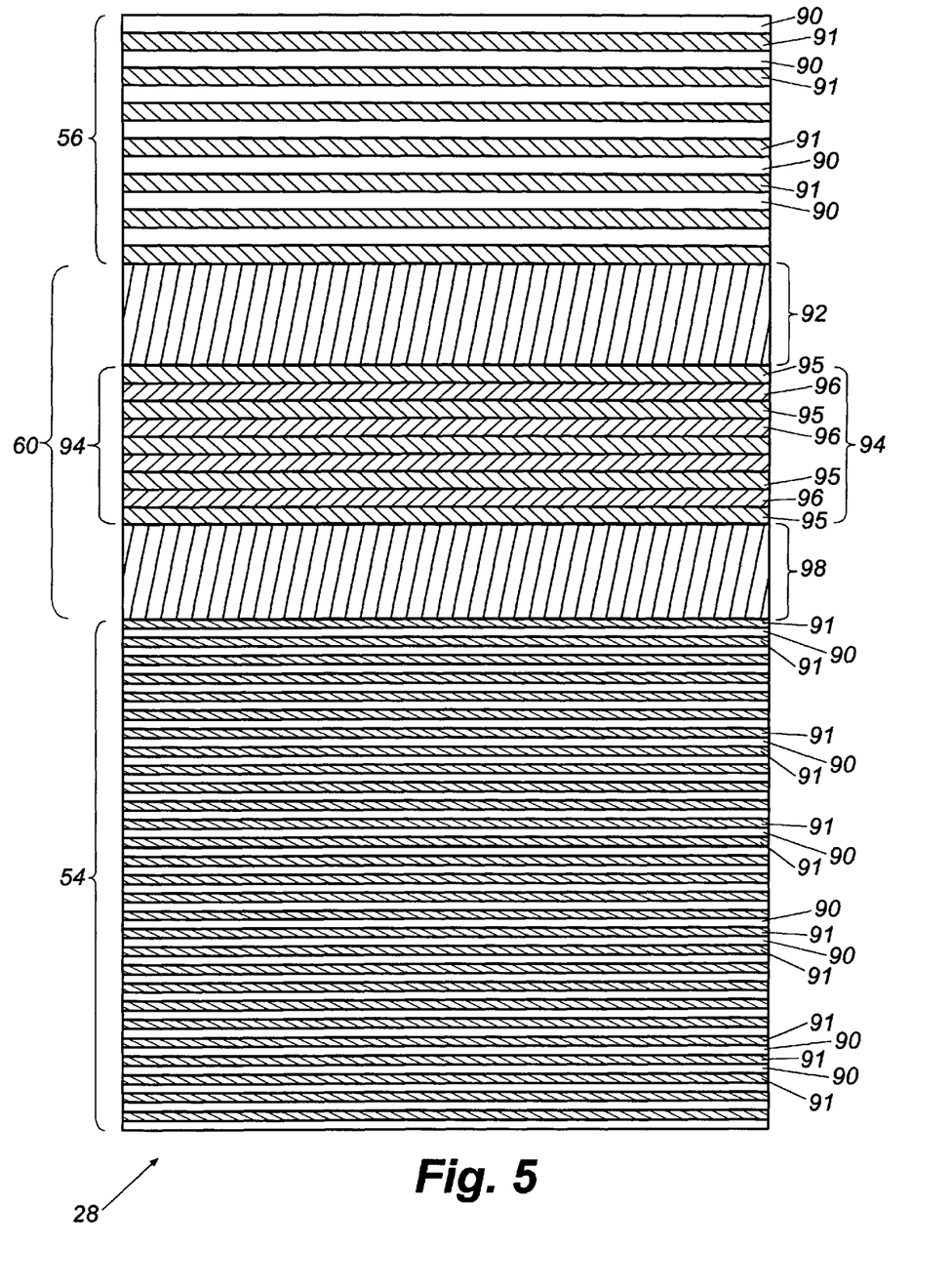
FIG. 5 illustrates the material layers of a waveguide according to a preferred embodiment of the present invention.

Referring to FIG. 5, channel 28 is comprised of an upper waveguide cladding 92, a core 94, and lower waveguide cladding 98. The core 94 is presently preferred to be a multilayer_core made up of a number of high nonlinearity material layers 95 and low nonlinearity material layers 96. The high and low nonlinearity material layers 95, 96 are created utilizing alternating layers of AlGaAs alloy having a 20–35% aluminum and a 80–90% aluminum content, respectively, as described with respect to FIG. 2. The total thickness of core 94 is presently preferred to be approximately equal to one micron thick, whereas both upper waveguide cladding 92 and lower waveguide cladding 98 are presently preferred to have a thickness of seven tenths of a micron. The top reflector 56 is presently preferred to be a distributed Bragg reflector made up of alternating reflective layers 90 and 91. The total thickness of top reflector 56 is presently preferred to be approximately 1.5 microns. The lower reflector 54, which is also preferred to be a distributed Bragg reflector, is composed of alternating reflective layers 90 and 91. The total thickness of bottom reflector 54 is presently preferred to be approximately 3 microns.

Figure 6:
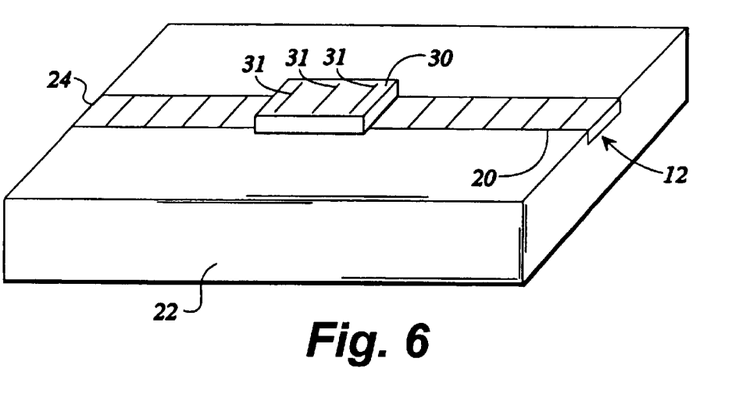
FIG. 6 illustrates an alternative embodiment of the serial-to-parallel converter of the present invention using a photodetector array.

As shown in FIG. 6, an array of photodetectors 30 (also referred to herein as "photodetector array 30") may be used in place of fiber optic array 25. As with the fiber optic array 25, the placement of the array of photodetectors 30 is dependent upon the location at which second-harmonic light is generated by the timing pulse-data pulse collisions. More specifically, each of the photodetectors of the photodetector array 30 is positioned at the location at which second-harmonic light is generated by a timing pulse-data pulse collision. Upon receiving second-harmonic light, the photodetectors of the photodetector array 30 convert the second-harmonic light into electrical signals for output made available at electrical outputs 31.

Where the input data pulses 14, 16, 18 comprise a data frame constituting one epoch of a series of time-domain multiplexed (TDM) bit sequences, then data pulses 14, 16, 18 may be demultiplexed by means of appropriately spaced parallel output channels. The output from the parallel waveguide output channels can be in the form of either optical signals from optical fiber array 25 or electrical signals from photodetector array 30.

Figure 7:
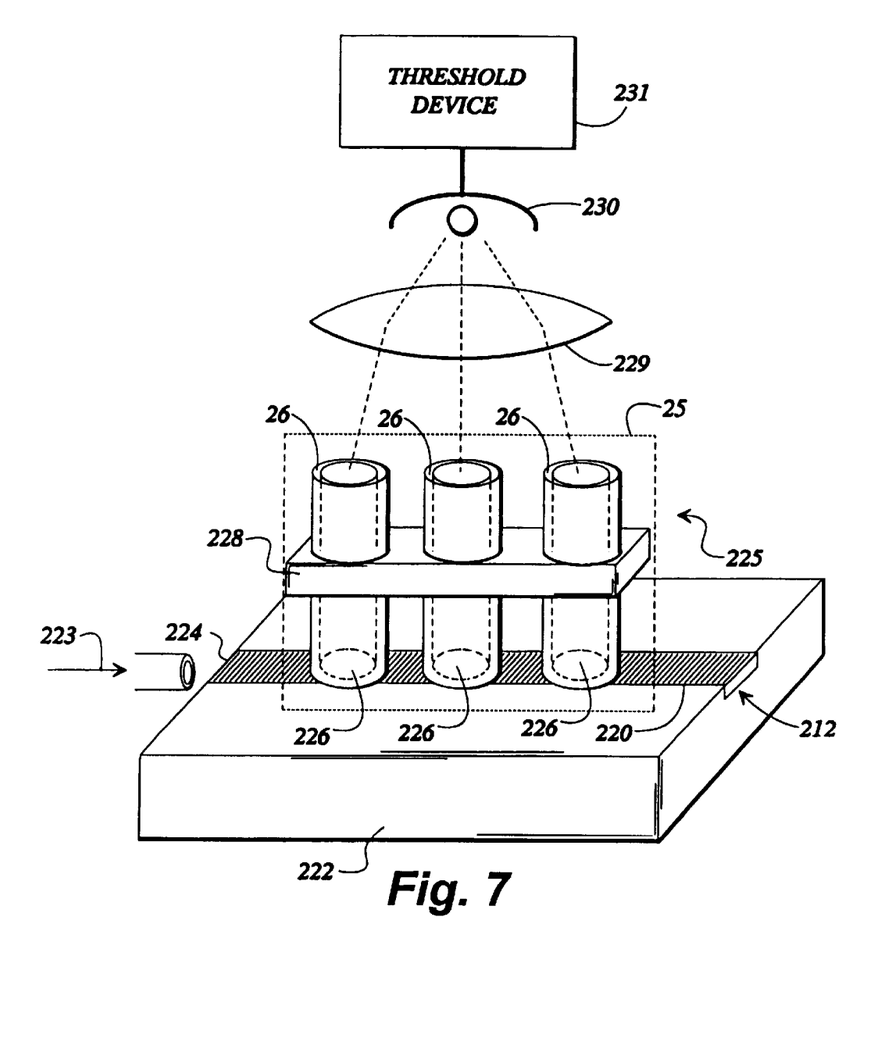
FIG. 7 illustrates an embodiment of the present invention for performing optical code recognition; and, FIG. 8 illustrates an embodiment of the present invention utilizing a spot-size converter.

Referring to FIG. 7, an application of the apparatus of the present invention for performing optical code recognition may be seen. The channel waveguide 220 has a waveguide input 224, which receives input optical serial data pulse stream 223, and a mirrored reflecting end 212. Adjoining the waveguide 220, and extending perpendicular thereto, is an array of optical fibers 25, each optical fiber 226 of the optical fiber array 25 passes through a fiber optic switch 228. The switch 228 can either block or pass the second-harmonic output of the waveguide 220 to a common detector 230. The switches 228 may be mechanical shutters, which would be programmed manually, or electro-optic switches that are controlled electrically. In either case, a switch 228 is programmed to a logical "high" data level by opening it, thereby allowing light to pass, and is programmed to a logical "low" data level by closing it and preventing light from passing through to the lens 229. The switches 228 are programmed according to the N-bit code word $C_N$ before the signal word $S_N$ arrives at the serial-to-parallel converter. The switches 228 pass their outputs to lens 229, which combines and spatially integrates the parallel optical outputs into a single optical signal. The lens output is fed to a time-integrating detector 230, which in turn passes its output to an electronic threshold device 231.

It is easily demonstrated that the output of the detector 230 is a maximum when the code word, $C_N$, and the signal word, $S_N$, are identical. Assume that $C_N$=[1010]. For $S_N$=[1100] the bit-wise product of $C_N$ and $S_N$=[1000], which when integrated equals 1. When $S_N$=[1010] then the bit-wise product is [1010], which equals 2 when integrated. However, when $S_N$=[1111], the bit-wise product of $C_N$ and $S_N$ also equals [1010] just as when $C_N$=$S_N$. The serial-to-parallel converter of the present invention cannot distinguish between these two signal words $S_N$; therefore, it is a requirement of the present invention that each signal word, $S_N$, may have no more high bits than the code word, $C_N$.

When the detector 230 output is a maximum, threshold detector 231 fires (i.e., produces an output), indicating electrical system recognition of the code word, $C_N$. Threshold detector 231 and detector 230 both operate at the frame rate, rather than the data-bit rate, because they need respond only to the product of $C_N$ and $S_N$, and not to each bit.

Figure 8:
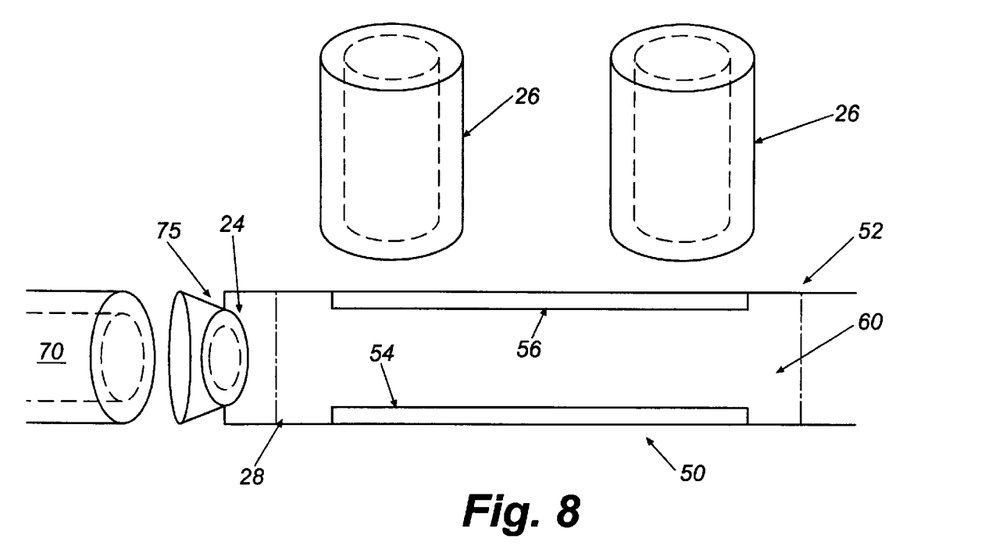

Referring to FIG. 8, an optical serial data pulse stream is provided to the waveguide input 24 by an optical fiber 70 having a mode-diameter. A spot size converter 75 is optically interposed between the optical fiber 70 and the waveguide input 24. The spot size converter 75 converts the mode-diameter of the optical fiber 70 to the mode-diameter of the waveguide 20. This is useful because, generally, the optical fiber 70 has a circular modal cross section whereas the mode of the waveguide 20, generally, has an elliptical cross section. By using a spot-size converter 75 to convert the mode of the optical fiber 70 to the mode of the waveguide 20 in a controlled fashion, a larger fraction of the power of the optical serial data pulse stream is coupled into the waveguide 20 and the overall device efficiency is improved. This applies to both the serial-to-parallel converter and the optical code recognition applications.

While the invention has been disclosed in its preferred forms, it will be apparent to those skilled in the art that many modifications, additions, and deletions can be made therein without departing from the spirit and scope of the invention and its equivalents as set forth in the following claims.

What is claimed is:

1. An apparatus for converting an optical serial data pulse stream into an optical parallel data pulse stream, comprising:
    a waveguide including a waveguide input for receiving an optical serial data pulse stream and further including a waveguide output for receiving optical pulses of second-harmonic radiation generated within the waveguide;
    a first reflector positioned at a location substantially opposed to the waveguide output, the first reflector being aligned to reflect a portion of the second-harmonic radiation propagating away from the waveguide output; and,
    a second reflector interposed at a location between the first reflector and the waveguide output, the second reflector selectively reflecting a portion of the second-harmonic radiation propagating toward the waveguide output.

2. The apparatus of claim 1, wherein the second-harmonic radiation includes a plurality of photons, wherein the first reflector and the second reflector at least partially define a resonant cavity, and wherein the first reflector and the second reflector are cooperatively positioned so as to direct at least a portion of the plurality of photons of the second-harmonic radiation through the resonant cavity more than once.

3. The apparatus of claim 1, wherein the second reflector allows to pass therethrough a portion of the second-harmonic radiation propagating toward the waveguide output.

4. The apparatus of claim 1, wherein the first reflector and the second reflector are arranged to form a vertical cavity that is resonant at the wavelength of the second-harmonic radiation.

5. The apparatus of claim 1, wherein the apparatus further comprises a fiber optic array having a plurality of fiber optic elements for collecting optical pulses of the second-harmonic radiation from the waveguide, the fiber optic array being optically coupled to the waveguide output.

6. The apparatus of claim 1, wherein the apparatus further comprises a device for converting second-harmonic radiation into electrical signals, the device being optically coupled to the waveguide output.

7. The apparatus of claim 1, wherein the waveguide optically couples to a fiber optic element, and wherein the apparatus further comprises a spot-size converter optically interposed between the fiber optic element and the waveguide.

8. The apparatus of claim 1, wherein the waveguide optically couples to a fiber optic element for communicating the optical serial data pulse stream to the waveguide, the optical serial data pulse stream having energy associated therewith, and wherein the apparatus further comprises a device optically interposed between the waveguide and the fiber optic element for focusing the energy of the optical serial data pulse stream into the waveguide.

9. The apparatus of claim 1, wherein the waveguide includes a material that inhibits two-photon absorption of the optical serial data pulse stream.

10. The apparatus of claim 1, wherein the waveguide includes a material that reduces the linear absorption of the optical parallel data pulse stream.

11. The apparatus of claim 1, wherein the waveguide further includes at least two high-nonlinearity layers of aluminum gallium arsenide.

12. The apparatus of claim 11, wherein the aluminum content of the aluminum gallium arsenide is in the range of twenty percent to thirty-five percent.

13. An apparatus for converting an optical serial data pulse stream into optical parallel pulse streams, comprising:
    a waveguide for receiving an optical serial data pulse stream having a plurality of data pulses and a timing pulse associated with the plurality of data pulses, the waveguide having a waveguide output substantially aligned to receive optical parallel pulse streams of second-harmonic radiation generated by the collision of the timing pulse with each data pulse of the plurality of data pulses;

a first reflector positioned within the waveguide at a location substantially opposed to the waveguide output, the first reflector being aligned to reflect a substantial portion of the second-harmonic radiation propagating away from the waveguide output; and, a second reflector positioned at a location substantially opposing the first reflector and at least partially defining a resonant cavity that increases the energy of the optical parallel pulse streams.

14. The apparatus of claim 13, wherein the second-harmonic radiation includes a plurality of photons, and wherein the first reflector and the second reflector are cooperatively positioned so as to direct at least a portion of the photons of the second-harmonic radiation in a first direction and subsequently in a second direction.

15. The apparatus of claim 13, wherein the first reflector and the second reflector are positioned so as to cooperatively produce reflected radiation that is in phase with the generated second-harmonic radiation.

16. The apparatus of claim 13, wherein at least one of the first reflector and the second reflector includes a Bragg reflector.

17. The apparatus of claim 13, wherein the apparatus further comprises a device for converting the pulses of the optical parallel pulse streams into electrical signals, the device being optically coupled to the waveguide.

18. The apparatus of claim 13, wherein the apparatus further comprises a fiber optic element optically coupled to the waveguide and having a mode-diameter, wherein the waveguide has a mode-diameter, and wherein the apparatus further comprises an interface element optically interposed between the waveguide and the fiber optic element to substantially match the mode-diameter of the waveguide and the mode-diameter of the fiber optic element.

19. The apparatus of claim 13, wherein the waveguide includes a core having a first plurality of material layers having a high nonlinearity and a second plurality of material layers having a nonlinearity that is substantially less than the nonlinearity of the first plurality of material layers.

* * * * *